United States Patent
Yanagita et al.

(10) Patent No.: US 6,867,110 B2
(45) Date of Patent: Mar. 15, 2005

(54) SEPARATING APPARATUS AND PROCESSING METHOD FOR PLATE MEMBER

(75) Inventors: Kazutaka Yanagita, Kanagawa (JP); Mitsuharu Kohda, Kanagawa (JP); Kiyofumi Sakaguchi, Kanagawa (JP); Akira Fujimoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 48 days.

(21) Appl. No.: 10/152,690

(22) Filed: May 23, 2002

(65) Prior Publication Data

US 2002/0174958 A1 Nov. 28, 2002

(30) Foreign Application Priority Data

May 25, 2001 (JP) ........................................ 2001-157933

(51) Int. Cl.$^7$ .............................................. H01L 21/46
(52) U.S. Cl. .................. 438/459; 438/458; 438/455
(58) Field of Search ................... 438/458, 459, 438/455; 156/344, 584, 529, 285

(56) References Cited

U.S. PATENT DOCUMENTS

| | | | |
|---|---|---|---|
| 2,191,513 A | 2/1940 | Bigelow ........................ | 141/7 |
| 2,517,394 A | 8/1950 | Tellier ........................ | 134/89 |
| 3,094,207 A | 6/1963 | Millhiser et al. ............ | 198/210 |
| 3,489,608 A | 1/1970 | Jacobs et al. ................. | 134/25 |
| 3,493,155 A | 2/1970 | Litant et al. .................... | 225/2 |
| 3,549,446 A | 12/1970 | Bennett et al. .............. | 156/230 |
| 3,549,466 A | 12/1970 | Kay et al. ...................... | 161/39 |
| 3,667,661 A | 6/1972 | Farmer .......................... | 225/2 |
| 3,730,410 A | 5/1973 | Altshuler .................... | 225/96.5 |
| 3,970,471 A | 7/1976 | Bankes et al. ................. | 134/6 |
| 4,047,973 A | 9/1977 | Williams ..................... | 134/10 |
| 4,208,760 A | 6/1980 | Dexter et al. ................. | 15/302 |
| 4,215,928 A | 8/1980 | Bayley et al. .............. | 354/319 |

(List continued on next page.)

FOREIGN PATENT DOCUMENTS

| | | |
|---|---|---|
| EP | 0709876 | 5/1996 |
| EP | 0840381 | 5/1998 |
| EP | 0843345 | 5/1998 |
| EP | 0867917 | 9/1998 |
| EP | 0926719 | 6/1999 |
| EP | 0999578 | 5/2000 |

(List continued on next page.)

OTHER PUBLICATIONS

203/0102082A1 Yanagita et al. Jun. 5, 2003, U.S. patent application Publication, Division of application 09/211,757, filed on Dec. 15, 1998, now pat. No. 6,418,999.*

"Single–Crystal Silicon on Non–Single–Crystal Insulators", G.W. Cullen, Journal of Crystal Growth, vol. 63, No. 3, pp. 429–590 (1983).

"Crystalline Quality of Silicon Layer Formed by FIPOS Technology", Kazuo Imai et al., Journal of Crystal Growth, vol. 63, pp. 547–553 (1983).

(List continued on next page.)

*Primary Examiner*—Matthew Smith
*Assistant Examiner*—Victor Yevsikov
(74) *Attorney, Agent, or Firm*—Fitzpatrick, Cella, Harper & Scinto

(57) ABSTRACT

This invention is to guarantee that in separating a plate member such as a bonded substrate stack, a fluid is injected to an appropriate portion of the plate member. While a bonded substrate stack (50) is rotated, the vertical position of its peripheral portion is measured throughout its perimeter by a measuring device (150). Then, while the vertical position of a nozzle (120) is dynamically adjusted on the basis of the measurement result, and at the same time, the bonded substrate stack (50) is rotated, the bonded substrate stack (50) is separated into two substrates at a porous layer by injecting a fluid ejected from the nozzle (120).

18 Claims, 13 Drawing Sheets

U.S. PATENT DOCUMENTS

| | | | |
|---|---|---|---|
| 4,850,381 A | 7/1989 | Moe et al. | 134/62 |
| 4,962,879 A | 10/1990 | Goesele et al. | 228/116 |
| 5,100,544 A | 3/1992 | Izutani et al. | 210/175 |
| 5,248,886 A | 9/1993 | Asakawa et al. | 250/442.11 |
| 5,255,853 A | 10/1993 | Munoz | 239/433 |
| 5,357,645 A | 10/1994 | Onodera | 15/97.1 |
| 5,371,037 A | 12/1994 | Yonehara | 437/86 |
| 5,374,564 A | 12/1994 | Bruel | 437/24 |
| 5,379,235 A | 1/1995 | Fisher et al. | 364/508 |
| 5,482,501 A | 1/1996 | Frits | 452/125 |
| 5,492,469 A | 2/1996 | Oda et al. | 431/266 |
| 5,510,019 A | 4/1996 | Yabumoto et al. | 210/137 |
| 5,653,247 A | 8/1997 | Murakami | 134/80 |
| 5,679,405 A | 10/1997 | Thomas et al. | 427/248.1 |
| 5,724,803 A | 3/1998 | Pea | 59/78.1 |
| 5,741,805 A | 4/1998 | Acharya | 514/397 |
| 5,747,387 A | 5/1998 | Koizumui et al. | 438/708 |
| 5,783,022 A | 7/1998 | Cha et al. | 156/344 |
| 5,792,709 A | 8/1998 | Robinson et al. | 438/692 |
| 5,795,401 A | 8/1998 | Itoh et al. | 134/6 |
| 5,810,028 A | 9/1998 | Ichikawa et al. | 134/66 |
| 5,820,329 A | 10/1998 | Derbinski et al. | 414/225 |
| 5,849,602 A | 12/1998 | Okamura et al. | 438/5 |
| 5,876,497 A | 3/1999 | Atoji | 117/85 |
| 5,928,389 A | 7/1999 | Jevtic | 29/25.01 |
| 5,934,856 A | 8/1999 | Asakawa et al. | 414/217 |
| 5,954,888 A | 9/1999 | Gupta et al. | 134/3 |
| 5,994,207 A | 11/1999 | Henley et al. | 438/515 |
| 6,007,675 A | 12/1999 | Toshima | 156/345 |
| 6,122,566 A | 9/2000 | Nguyen et al. | 700/218 |
| 6,168,499 B1 | 1/2001 | Jang | 451/8 |
| 6,221,740 B1 | 4/2001 | Bryan et al. | 438/458 |
| 6,277,234 B1 | 8/2001 | Freund et al. | 156/344 |
| 6,321,134 B1 | 11/2001 | Henley et al. | 700/121 |
| 6,418,999 B1 * | 7/2002 | Yanagita et al. | 156/584 |
| 6,436,226 B1 * | 8/2002 | Omi et al. | 156/584 |
| 6,527,031 B1 | 3/2003 | Yanagita et al. | 156/584 |
| 6,629,539 B1 | 10/2003 | Yanagita et al. | 134/78 |
| 6,672,358 B2 | 1/2004 | Yanagita et al. | 156/584 |
| 2003/0116275 A1 | 6/2003 | Yanagita et al. | 156/344 |
| 2004/0045679 A1 | 3/2004 | Yanagita et al. | 156/584 |

FOREIGN PATENT DOCUMENTS

| | | |
|---|---|---|
| EP | 1026729 | 8/2000 |
| EP | 1045448 | 10/2000 |
| JP | 60-005530 | 1/1985 |
| JP | 04-293236 | 10/1992 |
| JP | 05-021338 | 1/1993 |
| JP | 07-302889 | 11/1995 |
| JP | 11-045840 | 2/1999 |
| KR | 1998-33377 | 7/1998 |
| WO | WO 99/06110 | 2/1999 |
| WO | WO 01/04933 | 1/2001 |
| WO | WO 01/10644 | 2/2001 |

OTHER PUBLICATIONS

"Silicon–on–Insulator by Wafer Bonding: A Review", W.P. Maszara, Journal of Electrochemical Society, vol., 138, pp. 341–347 (1991).

"Light Scattering Topography Charachterization of Bonded SOI Wafer", H. Baumgart, t al., Extended Abstracts, vol. 91–2, pp. 733–734 (1991).

"Thinning of Bonded Wafer: Etch–Stop Approaches", Charles E. Hunt et al., Extend d Abstracts, vol. 91–2, pp. 696–697 (1991).

"Expitaxial Layer Transfer by Bond and Etch Back of Porous Si", Takao Yonehara et al., Applied Physics Letters, vol. 64, pp. 2108–2110 (1994).

"Electrolytic Shaping of Germanium and Silicon", A. Uhlir et al., Bell System Technical Journal, vol. 35, pp. 333–347 (1956).

"Oxidized Porous Silicon and It's Application", K. Nagano et al., The Transactions f th Institute of Electronics and Communication Engineers, The Institute of Electronics, Information and Communication Engineers, vol. 79, pp. 49–54, SSD 79–9549 (1979).

"A New Dielectric Isolation Method Using Porous Silicon", K. Imai, Solid–State Electronics, vol. 224, pp. 159–164 (1981).

"Silicon on Insulator Material by Wafer Bonding", Christine Harendt, Charles E. Hunt t al., Journal of Electronic Materials, vol. 20, pp. 267–277 (1991).

"Smart–Cut: A New Silicon On Insulator Material Technology Based on Hydrogen Implantation and Wafer Bonding", Michael Bruel, et al., Jpn. J. Appl. Phys. vol. 36, No. 3B, Part 01, pp. 1636–1641, Mar. 1, 1997.

* cited by examiner

SEPARATING APPARATUS AND PROCESSING METHOD FOR PLATE MEMBER

FIELD OF THE INVENTION

The present invention relates to a separating apparatus and processing method for a plate member such as a bonded substrate stack, a semiconductor substrate manufacturing method, and a semiconductor device manufacturing method.

BACKGROUND OF THE INVENTION

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.
(2) The radiation resistance can be increased.
(3) The operating speed of the device can be increased because the stray capacitance is small.
(4) No well step is necessary.
(5) Latch-up can be prevented
(6) A complete depletion type field effect transistor can be formed by thin film formation.

Since an SOI structure has the above various advantages, researches have been made on its formation method for several decades.

As a method, an SOI structure is formed by bonding a single-crystal Si substrate to another thermally oxidized single-crystal Si substrate by annealing or an adhesive. In this method, an active layer for forming a device must be uniformly thin. More specifically, a single-crystal Si substrate having a thickness of several hundred micron must be thinned down to the micron order or less.

To thin the substrate, polishing or selective etching can be used.

A single-crystal Si substrate can hardly be uniformly thinned by polishing. Especially, in thinning to the submicron order, the variation range is several ten %. As the wafer size becomes large, this difficulty becomes more pronounced.

The present applicant has disclosed a new SOI technique in Japanese Patent Laid-Open No. 5-21338. In this technique, a first substrate obtained by forming a porous layer on a single-crystal Si substrate and a non-porous single-crystal layer on its surface is bonded to a second substrate via an insulating layer. After this, the bonded substrate stack is separated into two substrates at the porous layer, thereby transferring the non-porous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred-Å to 10-μm thick SOI films can be manufactured by a single manufacturing apparatus.

To separate the bonded first and second substrates into two substrates without breaking the first and second substrates, the following methods are available: the two substrates are pulled in opposite directions while applying a force in a direction perpendicular to the bonding interface; a shearing force is applied parallel to the bonding interface (for example, the two substrates are moved in opposite directions in a plane parallel to the bonding interface, or the two substrates are rotated in opposite directions while applying a force in the circumferential direction); pressure is applied in a direction perpendicular to the bonding interface; a wave energy such as an ultrasonic wave is applied to the separation region; a peeling member (e.g., a sharp blade such as a knife) is inserted into the separation region parallel to the bonding interface from the side surface side of the bonded substrate stack; the expansion energy of a substance filling the pores of the porous layer functioning as the separation region is used; the porous layer functioning as the separation region is thermally oxidized from the side surface of the bonded substrate stack to expand the volume of the porous layer and separate the substrates; and the porous layer functioning as the separation region is selectively etched from the side surface of the bonded substrate stack to separate the substrates.

As a method of separating a bonded substrate stack, the present applicant disclosed an epoch-making technique in Japanese Patent Laid-Open No. 11-45840 (Japanese Patent No. 2,877,800). In the separating method described in Japanese Patent Laid-Open No. 11-45840, a bonded substrate stack having a porous layer or ion implantation layer serving as a separation layer is separated into two substrates by injecting a fluid into the side surface of the bonded substrate.

More specifically, in the separating method described in Japanese Patent Laid-Open No. 11-45840, the bonded substrate stack is held by a pair of holders (substrate holding portions) having a smaller size than that of the bonded substrate stack. A fluid is injected into the side surface of the bonded substrate stack while rotating it, thereby separating the bonded substrate stack into two substrates at the porous layer.

In holding the bonded substrate stack by the pair of holders, which have a size smaller than that of the bonded substrate stack, distortion may occur at the peripheral portion due to its own weight or the like, or the bonded substrate stack may be held with some distortion which has occurred in the manufacturing process remaining without being corrected. Assume that distortion exists in the bonded substrate stack held by holders. In this case, when a fluid is to be injected throughout the perimeter of the bonded substrate stack while rotating it, the fluid may be injected to a position deviated from an appropriate position (e.g., a bonding interface or separation layer).

For the sake of easy understanding, an extreme case will be described. For example, if the bonded substrate stack is largely distorted, a fluid injected from a nozzle, the position of which has been adjusted on the assumption that the bonded substrate stack is not distorted, is not injected to the separation layer or bonding interface of the bonded substrate stack. When this occurs, separation processing may not progress at all. This will be described with reference to FIG. 13. FIG. 13 shows a state wherein a bonded substrate stack 50 which is largely distorted is separated into two substrates at a separation layer 12. In the example shown in FIG. 13, the position of the actual porous separation layer 12 largely deviates from that of a porous layer without any distortion (the ideal position of the porous layer). In this case, the position of a nozzle 120 is adjusted on the assumption that the porous layer 12 is arranged at the ideal position. When separation is performed in this state, a fluid from the nozzle 120 is not injected to the separation layer 12, thereby preventing smooth separation. If large distortion exists at the perimeter of the bonded substrate stack 50, separation does not progress speedily. This may result in unsatisfactory separation.

The probability of the above-described unsatisfactory separation would increasingly become higher due to increase in size of a bonded substrate stack along with increase in size of a required SOI substrate.

In addition, in holding a bonded substrate stack by holders, some foreign substance may enter between the bonded substrate stack and holders. In this case as well, a fluid from a nozzle may be injected to a position deviated from the porous layer or bonding interface of the bonded substrate stack.

SUMMARY OF THE INVENTION

The present invention has been made in consideration of the above situation, and has as its object to guarantee that a fluid be injected to an appropriate position of a plate member such as a bonded substrate stack in separating the plate member.

According to the first aspect of the present invention, there is provided a separating method of separating a member using a fluid, comprising moving, at least one of a member which has a concave portion on a peripheral side of the member and a separation layer inside, and an ejecting portion, in accordance with a distortion amount of a peripheral portion of the member so that a fluid ejected from the ejecting portion hits the concave portion.

According to a preferred aspect of the present invention, the member is preferably a bonded member formed by bonding a first and second substrates, and at least one of the member and the ejecting portion is moved so that the fluid hits a bonding interface of the concave portion in separation.

According to a preferred aspect of the present invention, the member is preferably a bonded member obtained by bonding, through an insulating layer, a first substrate having a non-porous single-crystal silicon layer on the separation layer, and a second substrate.

According to a preferred aspect of the present invention, the distortion amount of the peripheral portion of the member is preferably measured in advance before the fluid is ejected or while the fluid is ejected.

According to the second aspect of the present invention, there is provided a separating apparatus for separating a plate member which has a separation layer, at the separation layer, comprising a holding portion for holding a plate member, an ejecting portion for ejecting a fluid so as to separate the plate member held by the holding portion, a measuring device for measuring a position of a peripheral portion of the plate member held by the holding portion, and a driving portion for dynamically driving at least one of the holding portion and the ejecting portion on the basis of a measurement result obtained by the measuring device so that a fluid ejected from the ejecting portion is injected into a concave portion on a peripheral side of the plate member held by the holding portion during separation of the plate member held by the holding portion.

According to a preferred aspect of the present invention, the driving portion preferably dynamically drives at least one of the holding portion and the ejecting portion on the basis of the measurement result obtained by the measuring device so that the fluid ejected from the ejecting portion is injected into a bonding interface of the plate member, which is located at the concave portion on the peripheral side surface, or into the separation layer through the concave portion.

According to a preferred aspect of the present invention, the measuring device preferably measures a position, of the peripheral portion of the plate member held by the holding portion, in a direction perpendicular to the separation layer. The driving portion preferably has a mechanism for dynamically driving at least one of the holding portion and the ejecting portion in the direction perpendicular to the separation layer on the basis of the measurement result obtained by the measuring device during separation of the plate member held by the holding portion.

According to a preferred aspect of the present invention, the driving portion preferably has a mechanism for dynamically changing a direction of the ejecting portion on the basis of a measurement result obtained by the measuring device during separation of the plate member held by the holding portion.

According to a preferred aspect of the present invention, the apparatus preferably further comprises a rotating mechanism for rotating the holding portion which holds the plate member so as to rotate the plate member about an axis perpendicular to the separation layer, and the fluid is injected to the plate member throughout a perimeter of the plate member by rotating the plate member while ejecting the fluid from the ejecting portion during separation of the plate member held by the holding portion.

According to a preferred aspect of the present invention, the measuring device preferably measures the position of the peripheral portion of the plate member rotated by the rotating mechanism throughout the perimeter of the plate member.

According to a preferred aspect of the present invention, after the plate member is held by the holding portion and before separation of the plate member is started, the measuring device preferably measures the position of the peripheral portion of the plate member held by the holding portion According to a preferred aspect of the present invention, measurement of the position of the peripheral portion of the plate member by the measuring device and separation of the plate member are preferably performed simultaneously, and the driving portion dynamically drives at least one of the holding portion and the ejecting portion on the basis of measurement results sequentially supplied from the measuring device in separation of the plate member.

According to a preferred aspect of the present invention, a width of the fluid to be ejected from the ejecting portion is preferably $1/20$ to $1/2$ that of the concave portion.

According to a preferred aspect of the present invention, the plate member to be separated preferably has a disk shape.

According to a preferred aspect of the present invention, the holding portion preferably horizontally holds the plate member to be separated.

According to a preferred aspect of the present invention, the separation layer is preferably a layer formed by anodization.

According to a preferred aspect of the present invention, the separation layer is preferably a layer formed by ion implantation.

According to the third aspect of the present invention, there is provided a processing method of processing a plate member which has a separation layer, comprising the holding step of holding a plate member by a holding portion, the measuring step of measuring a position of a peripheral portion of the plate member held by the holding portion, and the separation step of ejecting a fluid from an ejecting portion and separating the plate member held by the holding portion at the separation layer by using the fluid, wherein in the separation step, at least one of the holding portion and the ejecting portion is dynamically driven on the basis of a measurement result obtained in the measuring step so that the fluid ejected from the ejecting portion is injected into a concave portion on a peripheral side surface of the plate member held by the holding portion.

According to a preferred aspect of the present invention, in the separation step, at least one of the holding portion and the ejecting portion is preferably dynamically driven on the basis of the measurement result obtained by the measuring device so that the fluid ejected from the ejecting portion is injected into a bonding interface of the plate member, which is located at the concave portion on the peripheral side surface, or into the separation layer through the concave portion.

According to a preferred aspect of the present invention, in the measuring step, a position, of the peripheral portion of the plate member held by the holding portion, in a direction perpendicular to the separation layer is preferably measured.

According to a preferred aspect of the present invention, in the separation step, at least one of the holding portion and ejecting portion is preferably dynamically driven in the direction perpendicular to the separation layer on the basis of the measurement result obtained in the measuring step.

According to a preferred aspect of the present invention, in the separation step, a direction of the ejecting portion is preferably dynamically changed on the basis of the measurement result obtained in the measuring step.

According to a preferred aspect of the present invention, in the separation step, the plate member held by the holding portion is preferably separated while rotating the plate member about an axis perpendicular to the separation layer so that the fluid ejected from the ejecting portion may be injected into the plate member throughout a perimeter thereof.

According to a preferred aspect of the present invention, in the measuring step, the position of the peripheral portion of the plate member held by the holding portion is preferably measured throughout a perimeter of the plate member while rotating the plate member about the axis perpendicular to the separation layer.

According to a preferred aspect of the present invention, the separation step is preferably performed after the measuring step.

According to a preferred aspect of the present invention, the separation step is preferably performed simultaneously with the measuring step.

According to a preferred aspect of the present invention, a width of the fluid to be ejected from the ejecting portion is preferably 1/20 to 1/2 that of the concave portion.

According to a preferred aspect of the present invention, the plate member to be separated preferably has a disk shape.

According to a preferred aspect of the present invention, the holding portion preferably horizontally holds the plate member to be separated.

According to a preferred aspect of the present invention, the separation layer is preferably a layer formed by anodization.

According to a preferred aspect of the present invention, the separation layer is preferably a layer formed by ion implantation.

According to the fourth aspect of the present invention, there is provided a semiconductor substrate manufacturing method comprising the steps of forming a bonded substrate stack as a plate member by bonding a first substrate having a separation layer inside and a transfer layer on the separation layer to a second substrate, and separating the bonded substrate stack at the separation layer by using the processing method of the third aspect of the present invention.

According to the fifth aspect of the present invention, there is provided a semiconductor device manufacturing method comprising the steps of preparing an SOI substrate manufactured by using the manufacturing method of the fourth aspect of the present invention, and element-isolating an SOI layer of the SOI substrate and forming a transistor on the element-isolated SOI layer.

The transistor may be a partially depleted FET or fully depleted FET.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described below with reference to the accompanying drawings.

FIGS. 1A to 1E are schematic views for explaining a method of manufacturing a substrate having, e.g., an SOI structure according to a preferred embodiment of the present invention.

Figure 1A:
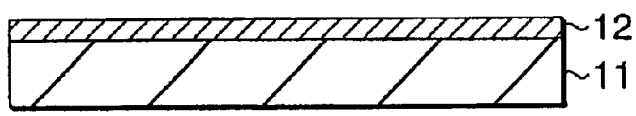
FIGS. 1A to 1E are schematic views for explaining the step of forming a porous layer in a substrate manufacturing method according to a preferred embodiment of the present invention.

In the step shown in FIG. 1A, a single-crystal Si substrate 11 to be used to form a first substrate (seed wafer) 10 is prepared, and a porous Si layer 12 serving as a separation layer is formed on the major surface of the single-crystal Si substrate 11. The porous Si layer 12 can be formed by, e.g., anodizing the single-crystal Si substrate 11 in an electrolyte solution (anodizing solution).

As the electrolyte solution, for example, a solution containing hydrogen fluoride, a solution containing hydrogen fluoride and ethanol, a solution containing hydrogen fluoride and isopropyl alcohol, or the like can be used. More specifically, as the electrolyte solution, for example, a solution mixture containing an HF aqueous solution (HF concentration=49 wt %) and ethanol at a volume ratio of 2:1 can be used.

The porous Si layer 12 may have a multilayered structure including two or more layers with different porosities. The porous Si layer 12 having a multilayered structure preferably includes a first porous Si layer with a first porosity on the surface side, and, under the first porous Si layer, a second porous Si layer with a second porosity higher than the first porosity. With such a multilayered structure, a non-porous layer 13 free from defects can be formed on the first porous Si layer in the step of forming the non-porous layer 13 later, and a bonded substrate stack can be separated at a desired position in the separation step layer. The first porosity is preferably 10% to 30% and, more preferably, 15% to 25%. The second porosity is preferably 35% to 70% and, more preferably, 40% to 60%.

When the above solution mixture (49 wt % hydrofluoric acid:ethanol=2:1) is used as the electrolyte solution, preferably, for example, the first layer (surface side) is formed at a current density of 8 mA/cm² for a process time of 5 to 11 min, and the second layer (inner surface side) is formed at a current density of 23 to 33 mA/cm² for a process time of 80 sec to 2 min.

Next, at least one of the following steps (1) to (4) is preferably executed. The steps (1) and (2) are preferably executed in this order. More preferably, the steps (1), (2), and (3), or (1), (2), and (4) are executed in this order. Most preferably, the steps (1), (2), (3), and (4) are executed in this order.

(1) Step of Forming Protective Film on Porous Walls in Porous Si Layer (Pre-Oxidation Step)

In this step, a protective film such as an oxide film or nitride film is formed on the porous walls in the porous Si layer 12, thereby preventing any increase in porous size by subsequent annealing. The protective film can be formed by performing annealing in an oxygen atmosphere (preferably at, e.g., 200° C. to 700° C., and more preferably at 300° C. to 500° C.). After that, the oxide film or the like formed on the surface of the porous Si layer 12 is preferably removed. This can be done by, e.g., exposing the surface of the porous Si layer 12 to a solution containing hydrofluoric acid.

(2) Hydrogen Baking Step (Pre-Baking Step)

In this step, the first substrate 10 on which the porous Si layer 12 is formed is annealed in a reduction atmosphere containing hydrogen at 800° C. to 1,200° C. With this annealing, pores on the surface of the porous Si layer 12 can be sealed to some extent. If a native oxide film is present on the surface of the porous Si layer 12, it can be removed.

(3) Trace Material Supply Step (Pre-Injection Step)

When the non-porous layer 13 is to be grown on the porous Si layer 12, it is preferably grown at a low speed by supplying a trace amount of raw material substance of the non-porous layer 13 at the initial stage of growth. With this growing method, atomic migration on the surface of the porous Si layer 12 is promoted, and pores on the surface of the porous Si layer 12 can be sealed. More specifically, the supply of the raw material is controlled such that the growth rate becomes 20 nm/min or less, preferably 10 nm/min or less, and more preferably, 2 nm/min or less.

(4) High-Temperature Baking Step (Intermediate Baking Step)

When annealing is executed in a reduction atmosphere containing hydrogen at a temperature higher than that in the above hydrogen baking step and/or trace material supply step, further sealing and flattening of the porous Si layer 12 can be realized.

Figure 1B:
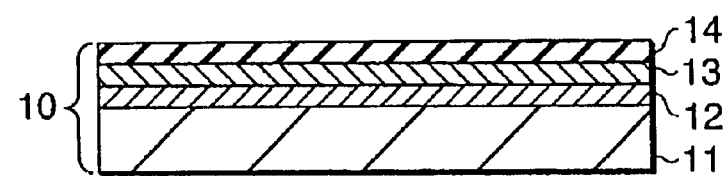

At the first stage of the step shown in FIG. 1B, the first non-porous layer 13 is formed on the porous Si layer 12. As the first non-porous layer 13, an Si layer such as a single-crystal Si layer, poly-Si layer, or amorphous Si layer, Ge layer, SiGe layer, SiC layer, C layer, GaAs layer, GaN layer, AlGaAs layer, InGaAs layer, InP layer, or InAs layer can be used.

At the second stage of the step shown in FIG. 1B, an $SiO_2$ layer (insulating layer) 14 as the second non-porous layer is formed on the first non-porous layer 13. With this process, the first substrate 10 is obtained. The $SiO_2$ layer 14 can be formed, e.g., in an $O_2/H_2$ atmosphere at 1,100° C. for 10 to 33 min.

Figure 1C:
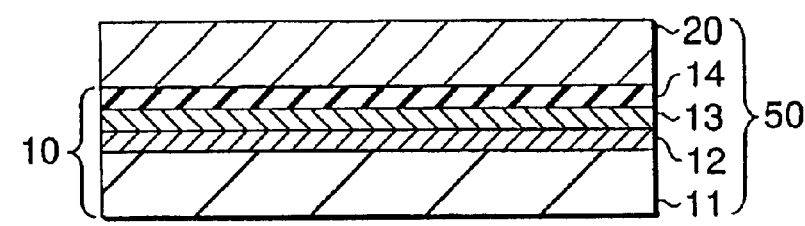

In the step shown in FIG. 1C, a second substrate (handle wafer) 20 is prepared and brought into tight contact with the first substrate 10 at room temperature while making the insulating layer 14 face the second substrate 20, thereby forming a bonded substrate stack 30.

The insulating layer 14 can be formed either on the single-crystal Si layer 13 side, or on the second substrate 20, or on both the single-crystal Si layer 13 and the second substrate 20 as long as the state shown in FIG. 1C is obtained when the first and second substrates are brought into tight contact with each other. However, when the insulating layer 14 is formed on the first non-porous layer (e.g., a single-crystal Si layer) 13 side serving as an active layer, as described above, the bonding interface between the first substrate 10 and the second substrate 20 can be separated from the active layer, and a semiconductor substrate such as an SOI substrate with a higher quality can be obtained.

After the substrates 10 and 20 are completely brought into tight contact, processing of strengthening bonding between the substrates is preferably executed. As an example of this processing, processing of, e.g., 1) executing annealing in an $N_2$ atmosphere at 1,100° C. for 10 min and 2) executing annealing (oxidation) in an $O_2/H_2$ atmosphere at 1,100° C. for 50 to 100 min is preferably performed. In addition to this processing, or in place of this processing, anodic bonding and/or compression may be executed.

As the second substrate 20, an Si substrate, a substrate obtained by forming an $SiO_2$ layer on an Si substrate, a transparent substrate formed from quartz or the like, or a sapphire substrate can be used. However, a substrate of another type which has a sufficiently flat surface to be bonded may be used as the second substrate 20.

Figure 1D:
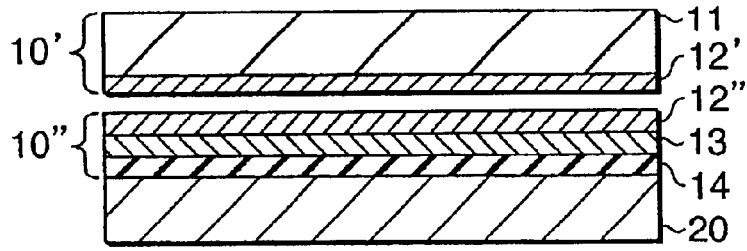

In the step shown in FIG. 1D, the bonded substrate stack 30 is separated at the fragile porous layer 12 with a low mechanical strength using a separating method to be described later.

Figure 1E:
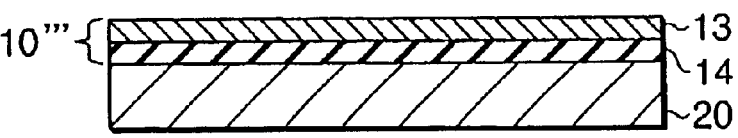

In the step shown in FIG. 1E, a porous layer 12" on the non-porous layer 13 after separation is selectively removed by etching or the like.

Also, a porous layer 12' on the single-crystal Si substrate 11 on a separated first substrate 10' after separation is selectively removed by etching or the like. The single-crystal Si substrate 11 obtained in this way can be reused as a substrate for forming the first substrate 10 or as the second substrate 20.

As a bonded substrate stack, a substrate prepared by the following method may be employed. First, a semiconductor substrate represented by a single-crystal Si substrate such as a mirror wafer or epitaxial wafer is prepared. An insulating film such as a thermal silicon oxide film is formed on the surface of the substrate, as needed. Next, ions such as positive or negative hydrogen ions or rare gas ions are implanted into the substrate by ion implantation using a line beam or plasma immersion, thereby forming a relatively heavily doped ion implantation layer serving as a separation layer at a predetermined depth from the surface. The first substrate is obtained in the above manner.

Next, the second substrate is prepared according to the same procedure as described above and bonded to the first substrate in accordance with the above-described bonding method. With this process, a bonded substrate stack having a layer to be transferred (transfer layer) inside can be obtained.

The ion implantation layer is distorted or contains defects or pores formed from microcavities due to the implanted ions. Such an ion implantation layer has a relatively low mechanical strength and therefore functions as a separation layer.

Figure 11:
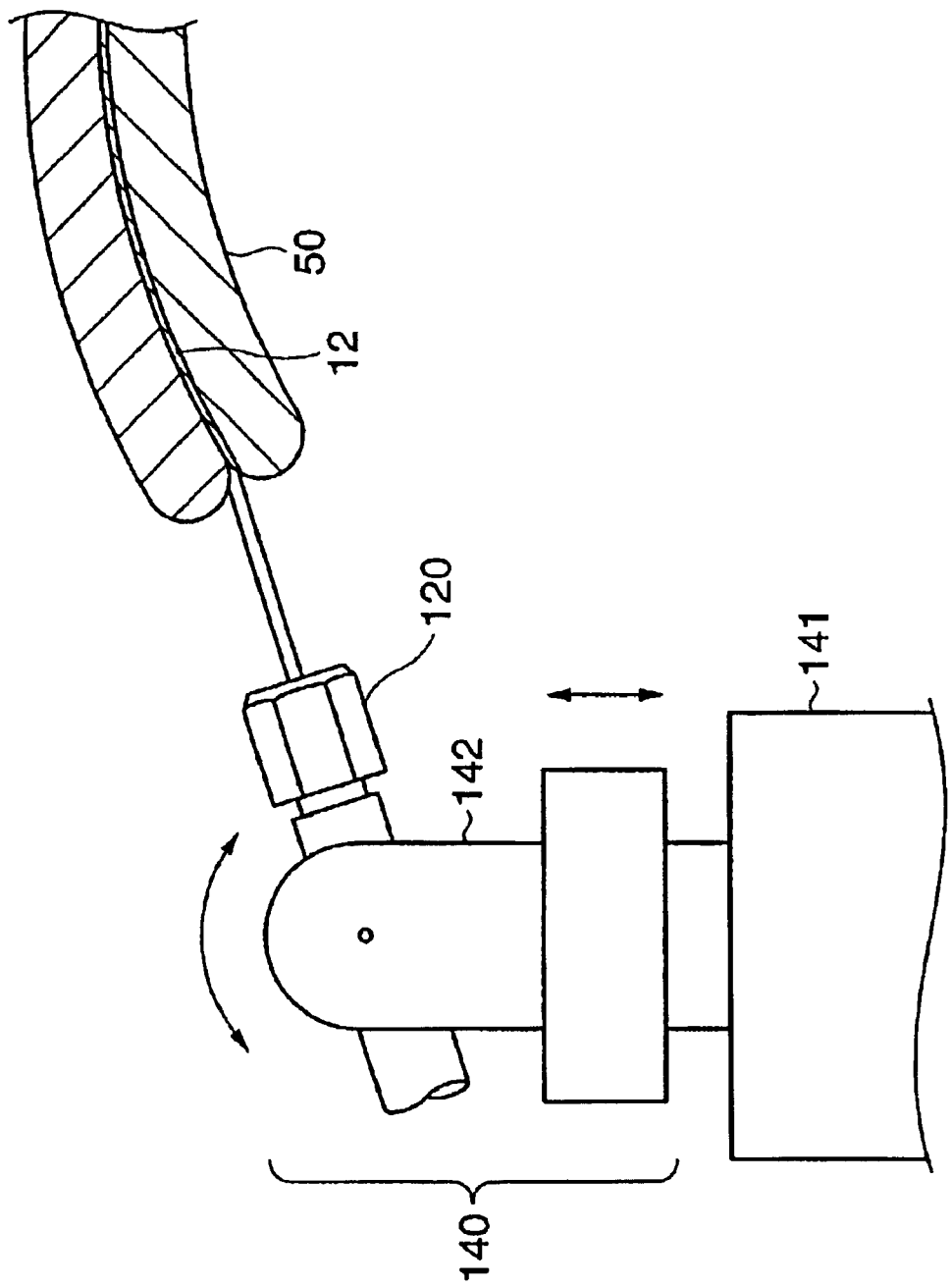
FIG. 11 is a view showing an example of a position adjusting mechanism comprising a mechanism for adjusting the elevation angle and position of the nozzle.

A separating method and apparatus according to a preferred embodiment of the present invention, which can be applied to the separation step shown in FIG. 11), will be described next. The separating apparatus according to a preferred embodiment of the present invention can be used to separate a bonded substrate stack (an example of a plate member) having a separation layer such as a porous layer formed by anodization or an ion implantation layer formed by ion implantation into two substrates at the separation layer. Referring to FIG. 1D, the bonded substrate stack is separated inside the separation layer. However, the bonded substrate stack may be separated at the interface between the porous layer 12 and non-porous layer 13, and/or that between the single-crystal Si substrate 11 and porous layer 12. It is also preferable to separate the bonded substrate stack near the interface between the porous layer 12 and non-porous layer 13 by controlling, e.g., the layer structure of the separation layer.

The separating apparatus comprises an ejecting portion (a nozzle) for ejecting a fluid and a substrate holder portion (a holder) for holding a plate member. The separating apparatus further includes a measuring device (e.g., a laser displacement meter) for measuring, after the bonded substrate stack having a separation layer is held by the substrate holding portion, the position (e.g., a position in a direction perpendicular to the separation layer) of the peripheral portion of the bonded substrate stack throughout its perimeter. In addition, the separating apparatus further includes a driving portion for dynamically driving at least one of the substrate holding portion (the bonded substrate stack) and fluid ejecting portion on the basis of a measurement result for the bonded substrate stack during separation of the bonded substrate stack. Note that the peripheral portion denotes, e.g., a horizontal surface portion adjacent to the beveling portion of a wafer. The peripheral portion may denote a portion which is not adjacent to the beveling portion and is somewhat near to the center side. Typically, separation is performed by rotating a bonded substrate stack about an axis perpendicular to both surfaces or the separation layer of the bonded substrate stack while injecting a fluid into the side surface of the bonded substrate stack. In separation, the bonded substrate stack is typically rotated once or more while a fluid is injected to its side surface. Dynamic driving of at least one of the substrate holding portion (the bonded substrate stack) and fluid ejecting portion is performed in synchronism with rotation on the basis of the above-described measurement result. Preferably, a bonded substrate stack to be separated has a concave portion throughout the perimeter of its side surface. This concave portion can be formed by manufacturing a bonded substrate stack using the first substrate (seed wafer) and second substrate (handle wafer). Each of the first and second substrates employs a wafer which has a beveling portion with a round sectional shape.

Figure 2:
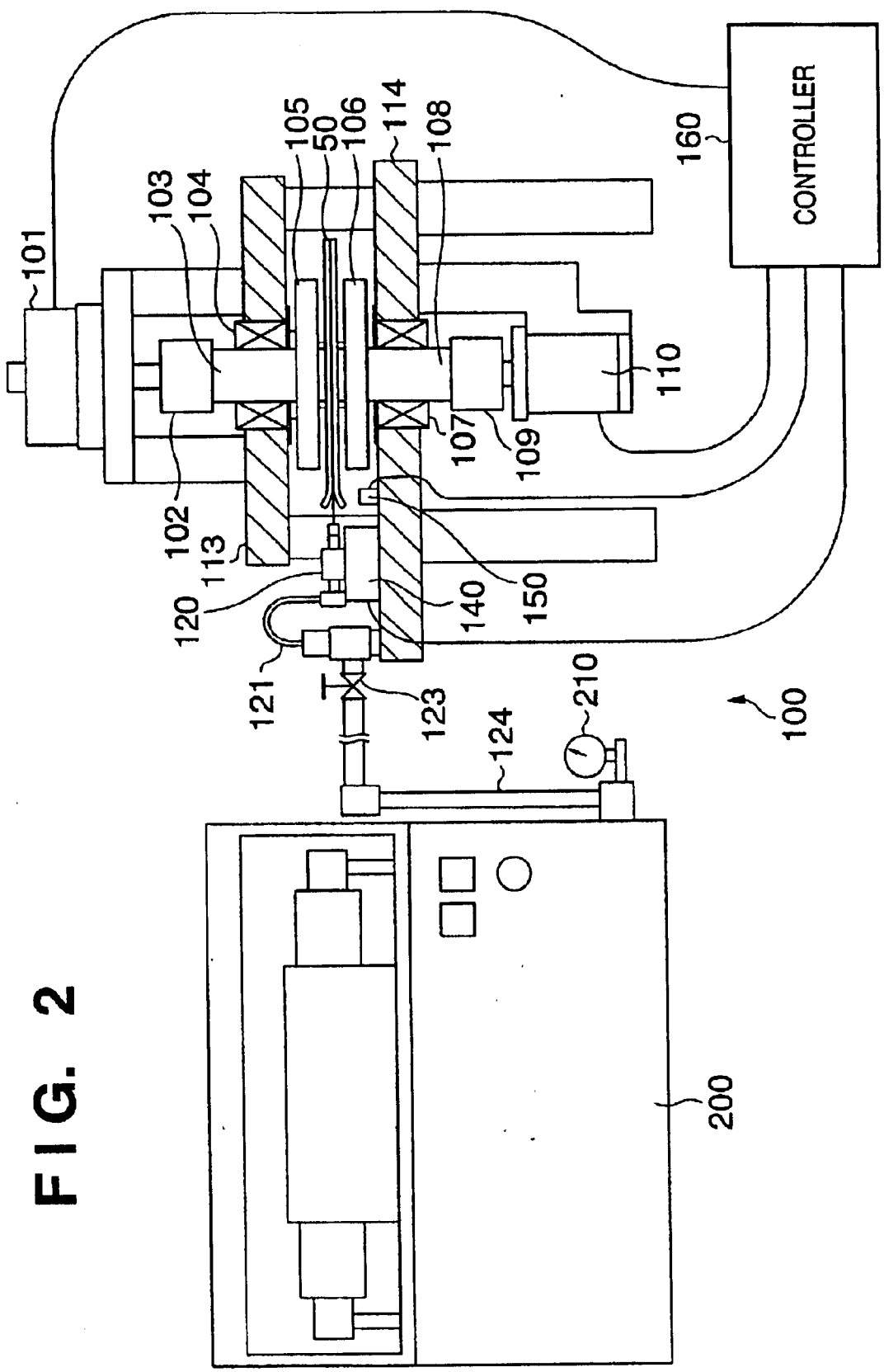
FIG. 2 is a view showing the arrangement of a separating apparatus according to a preferred embodiment of the present invention.

FIG. 2 is a view showing the arrangement of the separating apparatus according to a preferred embodiment of the present invention. A separating apparatus 100 horizontally holds a bonded substrate stack 50 as a plate member to be separated and ejects a fluid (e.g., water) toward the concave portion (at which a separation layer is exposed or which has a separation layer inside) of the bonded substrate stack 50 while rotating it, thereby separating the bonded substrate stack 50 into two substrates at the porous layer (separation layer). Note that the fluid is preferably injected to the bonding interface. This injection of the fluid to the interface causes stress to act more effectively so as to separate the two wafers.

The bonded substrate stack 50 is held by a pair of substrate holding portions 105 and 106 which have a common central axis. The bonded substrate stack 50 may be held by a chuck mechanism provided in the pair of substrate holding portions 105 and 106 or clamped by the pair of substrate holding portions 105 and 106.

The upper substrate holding portion 105 is connected to a motor 101 through a rotating shaft 103 and coupling 102. The rotational speed of the motor 101 is arbitrarily controlled by a controller 160. The rotating shaft 103 is axially supported by an upper table 113 through a bearing 104.

The lower substrate holding portion 106 is connected to an air cylinder 110 through a rotating shaft 108 and coupling 109. Hence, the lower substrate holding portion 106 is vertically moved by the air cylinder 110. The air cylinder 110 is driven to set the bonded substrate stack 50 in the separating apparatus 100 and detach the separated substrates from the separating apparatus 100. The air cylinder 110 can also be driven to apply a press force or tensile force (when the bonded substrate stack is chucked) to the bonded substrate stack 50 as needed during the separation processing. The air cylinder 110 is controlled by the controller 160. The rotating shaft 108 is axially supported by a lower table 114 through a bearing 107.

A nozzle (ejecting portion) 120 for ejecting a fluid is arranged on the lower table 114. The position of the nozzle 120 is adjusted, e.g., in a direction (vertical direction)

parallel to the axial direction of the bonded substrate stack 50 and/or in a direction (horizontal direction) parallel to the planar direction of the bonded substrate stack 50. In separation processing, the nozzle 120 is directed to the porous layer (concave portion) of the bonded substrate stack 50 by the position adjusting mechanism 140.

The nozzle 120 is connected to the outlet of a servo-driven pump 200 through a high-pressure hose 121, valve 123, and high-pressure pipe 124. The servo-driven pump 200 has a pressure gauge 210 for detecting the pressure of the fluid at the outlet. On the basis of the output from the pressure gauge 210, the variation in pressure of the fluid is suppressed within a predetermined value (e.g., 10% of the target pressure).

A measuring device (including, e.g., a laser displacement meter) 150 is arranged on the lower table 114 to measure the position of the peripheral portion of the bonded substrate stack 50, which is held by the pair of substrate holding portions 105 and 106, throughout its perimeter. The measuring device 150 may be arranged on the upper table 113 or another member as far as deviation of the peripheral portion from a reference value can be measured. The measuring device 150, in this embodiment, measures the position (vertical position) of the peripheral portion of the bonded substrate stack 50 with respect to the axial direction (vertical direction) of the bonded substrate stack 50. In this embodiment, the bonded substrate stack 50 is measured throughout its perimeter while rotating, by a rotational force generated by the motor 101, the bonded substrate stack 50 held by the pair of substrate holding portions 105 and 106.

After the bonded substrate stack 50 is held by the pair of substrate holding portions 105 and 106, the position (in this case, the axial position, i.e., the vertical position of the bonded substrate stack 50) of its peripheral portion is measured throughout its perimeter by the measuring device 150, typically before separation of the bonded substrate stack 50 is started. A measurement result obtained by the measuring device 150 is transmitted to the controller 160. In actually separating the bonded substrate stack 50, the controller 160 drives the position adjusting mechanism 140 in synchronism with rotation of the bonded substrate stack 50 on the basis of the measurement result obtained by the measuring device 150 so that a fluid ejected from the nozzle 120 may always be injected into the concave portion (more preferably, the bonding interface) of the bonded substrate stack 50. This allows the fluid ejected from the nozzle 120 to efficiently contribute to separation of the bonded substrate stack 50. Even when the bonded substrate stack 50 is distorted, or the bonded substrate stack 50 is held at a position deviated from an ideal position due to some foreign substance, such as particles and dusts, between the substrate holding portions and bonded substrate stack 50, the bonded substrate stack 50 can be separated with a good reproducibility. As described above, as the size of the bonded substrate stack 50 becomes large, a problem such as distortion of the bonded substrate stack 50 becomes more pronounced. According to the separating apparatus of this embodiment, the bonded substrate stack 50 can be separated with a good reproducibility regardless of its size.

When the bonded substrate stack 50 is rotated once or more (by 360° or more) in separation, driving of the position adjusting mechanism 140 in synchronism with rotation of the bonded substrate stack 50 is preferably continued during the one or more turns. This driving of the position adjusting mechanism 140 may be performed only while the bonded substrate stack 50 is rotated about once. This is because after the peripheral portion of the bonded substrate stack 50 is separated, even when a pressure lower than that in separation of the peripheral portion is applied (i.e., only part of a fluid is injected into the porous layer), the bonded substrate stack 50 can easily be separated.

Figure 3:
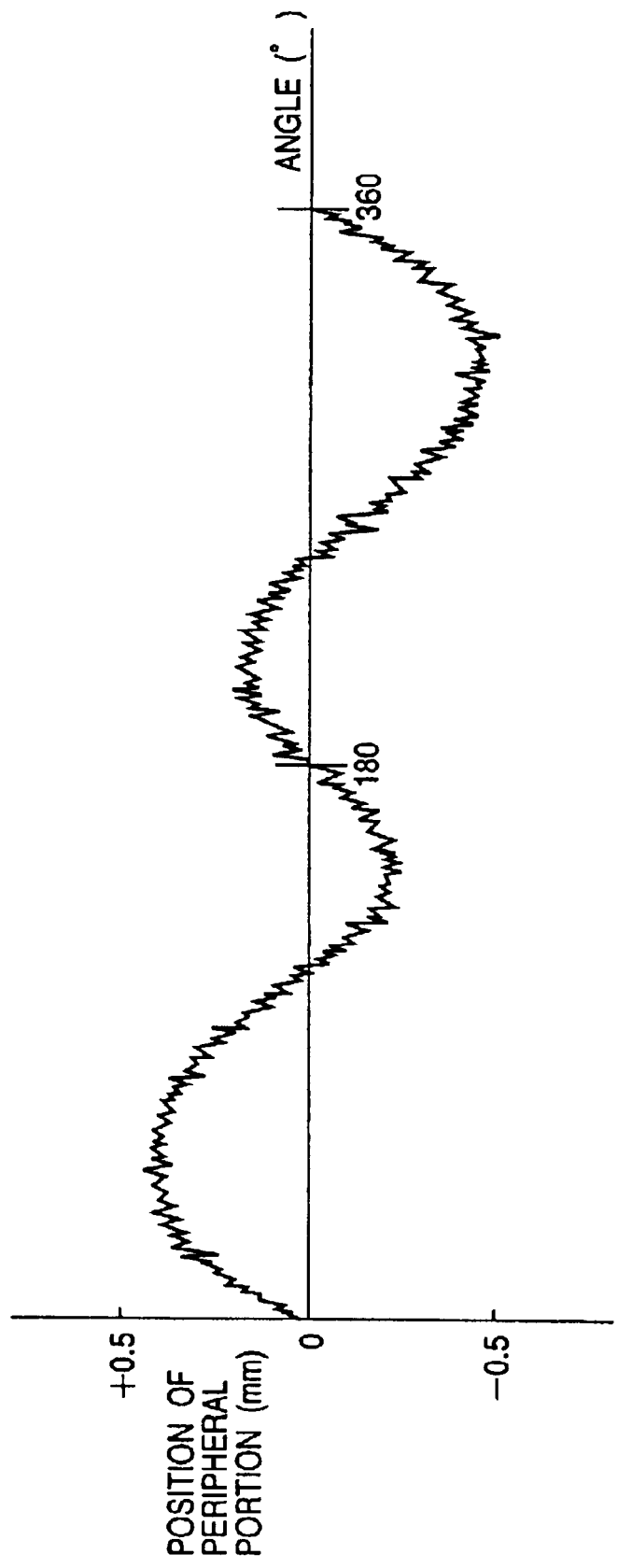
FIG. 3 is a graph showing an example of a measurement result obtained by a measuring device.

FIG. 3 is a graph showing an example of a measurement result obtained by the measuring device 150. The measurement result provides the vertical position of the peripheral portion of the bonded substrate stack 50 as a function of the rotational angle (0° to 360°) of the bonded substrate stack 50. The example shown in FIG. 3 shows the deviation amount of the position of the peripheral portion of the bonded substrate stack 50 using as a reference position (reference plane) the vertical position of the bonding interface of the bonded substrate stack 50 in a state (ideal state) wherein the bonded substrate stack 50 has no distortion and is appropriately held by the substrate holding portions 105 and 106. Note that this reference position (reference plane) can be defined arbitrarily. For example, the reference position may be defined on the lower surface, upper surface, or the like of the bonded substrate stack 50 in the ideal state. Alternately, the reference position may be defined at a predetermined position of the substrate holding portion 105, 106, or any other member.

Figure 4:
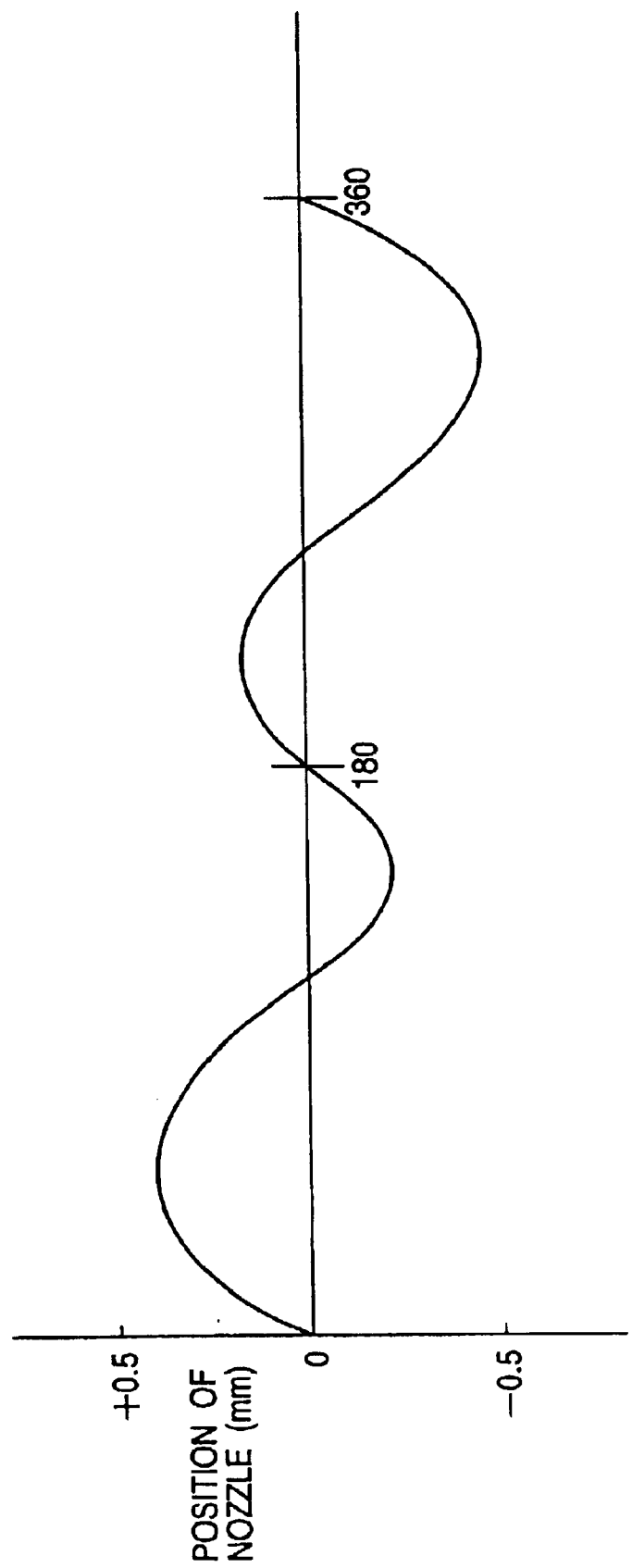
FIG. 4 is a graph showing the vertical position of a nozzle which is driven by a position adjusting mechanism on the basis of the measurement result shown in FIG. 3.

FIG. 4 is a graph showing the vertical position of the nozzle 120 which is driven by the position adjusting mechanism 140 on the basis of the measurement result shown in FIG. 3. The example shown in FIG. 4 provides the vertical position of the nozzle 120 obtained by using a reference position common to the measurement result in FIG. 3 as a reference.

Figure 10:
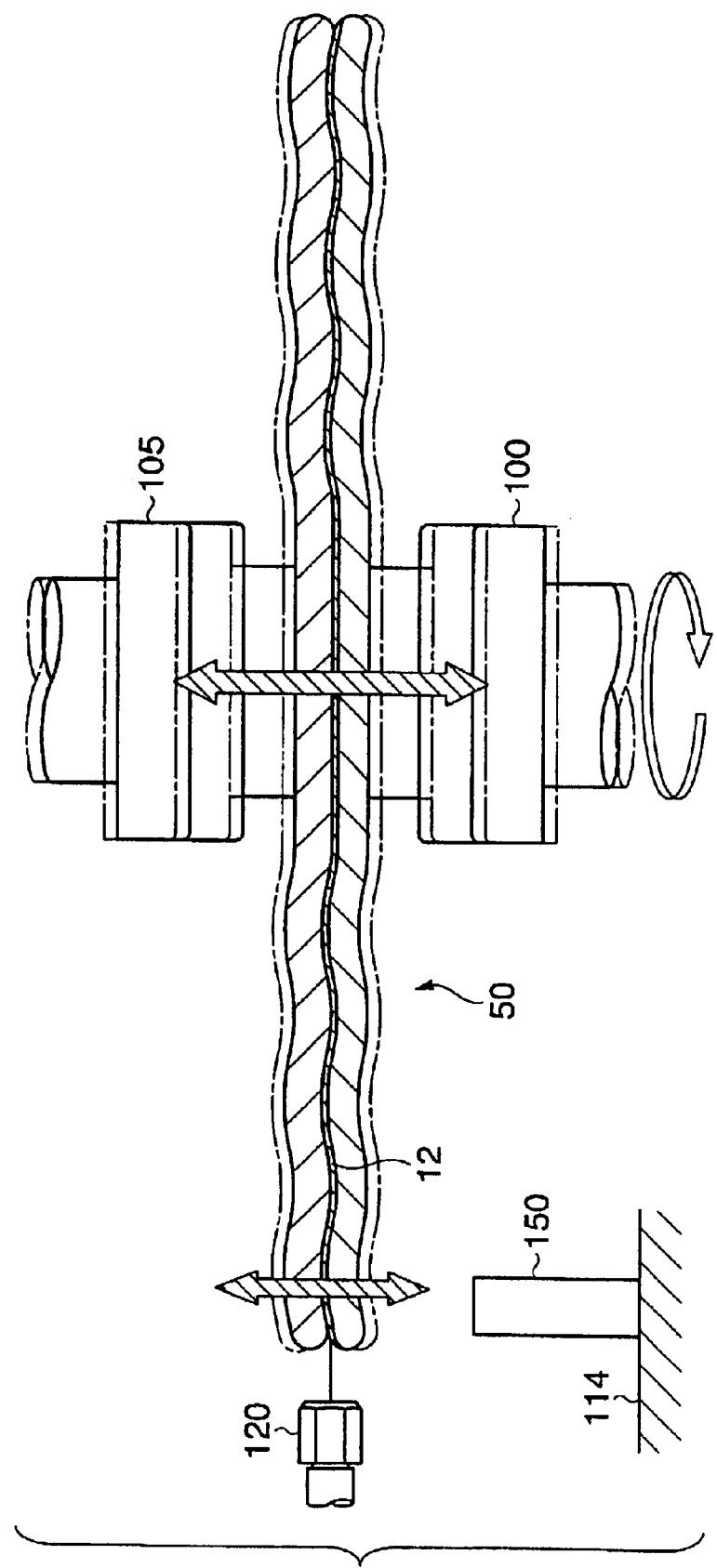
FIG. 10 is a view showing a state wherein the bonded substrate stack is separated while vertically moving substrate holding portions (the bonded substrate stack) in synchronism with its rotation.

As described above, in the separating apparatus 100 shown in FIG. 2, the axial position (vertical position) of the bonded substrate stack 50 is fixed, and in this state, the nozzle 120 is dynamically moved in the vertical direction on the basis of the measurement result obtained by the measuring device 150. However, as shown in FIG. 10, the bonded substrate 50 (the substrate holding portions 105 and 106) may be dynamically moved in the vertical direction on the basis of the measurement result obtained by the measuring device 150 while keeping the position of the nozzle 120 fixed, instead of vertically moving the nozzle 120. Besides, both of the nozzle 120 and bonded substrate stack 50 may dynamically be moved in the vertical direction in synchronism with rotation of the bonded substrate stack 50 on the basis of the measurement result obtained by the measuring device 150.

Alternatively, a fluid ejected from the nozzle 120 may always be injected into the concave portion (particularly, bonding interface) of the bonded substrate stack 50 by adding a function of changing the elevation angle of the nozzle 120 to the position adjusting mechanism 140 and adjusting the elevation angle and position of the nozzle 120 in synchronism with rotation of the bonded substrate stack 50 on the basis of the measurement result obtained by the measuring device 150. FIG. 11 is a view showing an example of the position adjusting mechanism 140 comprising a mechanism for adjusting the elevation angle and position of the nozzle 120. The position adjusting mechanism 140 in FIG. 11 includes a first adjusting mechanism 141 for adjusting the vertical position (the position in the planar direction) of the nozzle 120 and a second adjusting mechanism 142 for adjusting the elevation angle of the nozzle 120.

The position of the peripheral portion of the bonded substrate stack 50 may be measured in the planar direction as well as the axial position, and the nozzle 120 may be driven in the planar direction of the bonded substrate stack 50 in synchronism with rotation of the bonded substrate stack 50 on the basis of the measurement result. This is particularly effective, e.g., when the elevation angle and position of the nozzle 120 are changed in synchronism with rotation of the bonded substrate stack 50, and when separation is performed while keeping a predetermined distance between the nozzle 120 and bonded substrate stack 50.

The bonded substrate stack 50 may be separated simultaneously with measurement of the position of the peripheral portion of the bonded substrate stack 50 by the measuring device 150. In this case, the controller drives the position adjusting mechanism 140 on the basis of measurement signals which are sequentially supplied from the measuring device 150. At this time, if a measurement point (rotational angle) of the bonded substrate stack 50 to be measured by the measuring device 150 and a position (rotational angle) to which a fluid is ejected are made to almost match with each other, the nozzle (and/or the bonded substrate stack) can be driven in accordance with any dynamic deformation of the bonded substrate stack 50 due to fluid injection. After any distortion at a portion to which the fluid is going to be injected is measured, the position of the wafer or nozzle is controlled in accordance with the measured distortion and the fluid is injected to the portion. This processing is sequentially repeated.

In the separating apparatus 100 shown in FIG. 2, the bonded substrate stack 50 is held horizontally. However, the bonded substrate stack 50 may be held vertically. When the bonded substrate is held horizontally, the bonded substrate stack 50 can easily be transferred to/from other apparatuses.

A separating method using the separating apparatus 100 will be described next.

First, the air cylinder 110 is actuated to move the lower substrate holding portion 106 downward, and the bonded substrate stack 50 is transferred to a predetermined position between the pair of substrate holding portions 105 and 106 by a transfer robot or the like. The air cylinder 110 is actuated to move the lower substrate holding portion 106 upward and cause the pair of substrate holding portions 105 and 106 to hold the bonded substrate stack 50. If the pair of substrate holding portions 105 and 106 have a chuck mechanism, they may be actuated to chuck the bonded substrate stack 50. In addition, a press force or tensile force may be applied to the bonded substrate stack 50 by the air cylinder 110. The bonded substrate stack 50 may be held by applying a press force to the bonded substrate stack 50 by the air cylinder 110 without chucking the bonded substrate stack 50.

Figure 5:
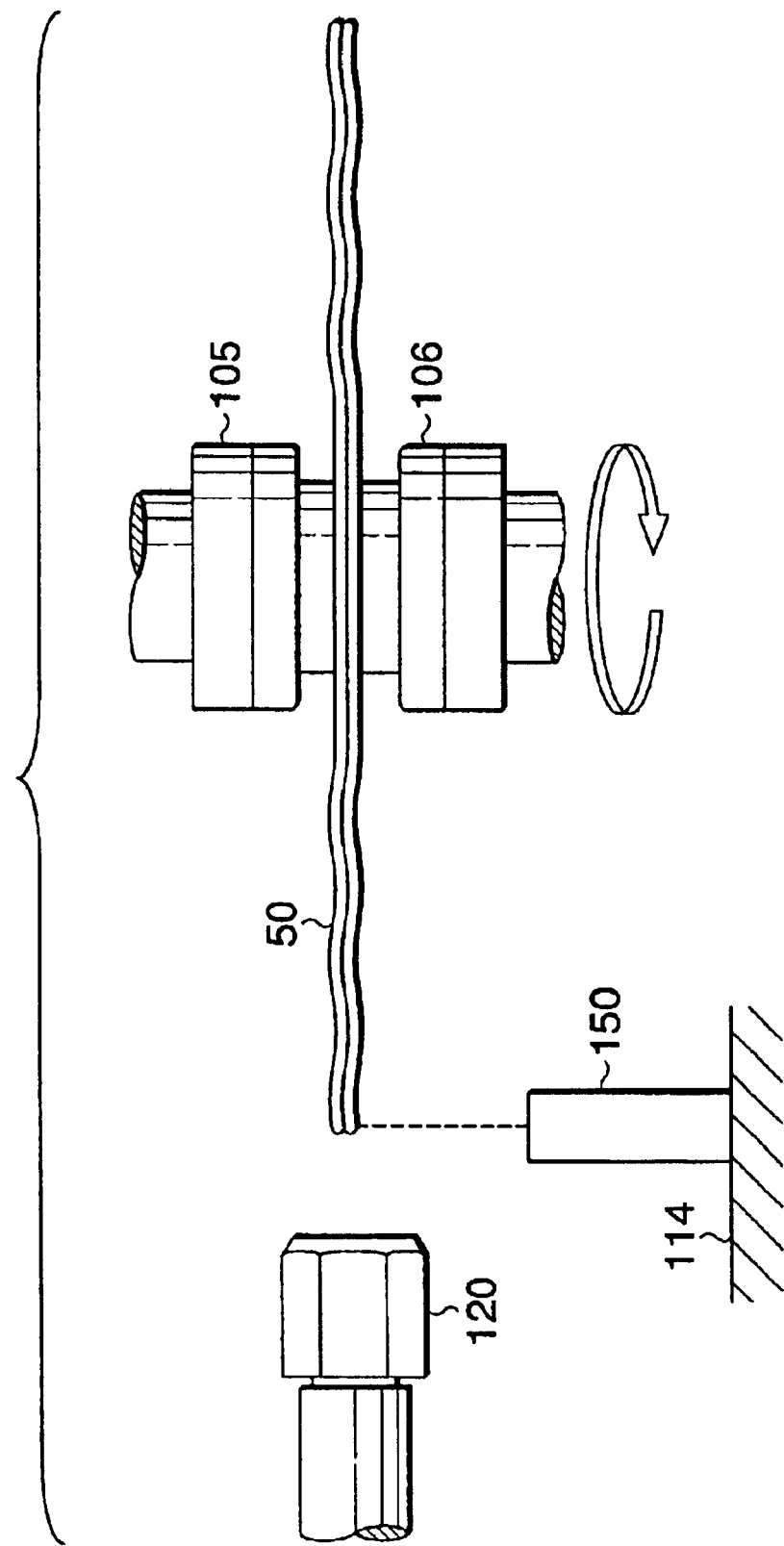
FIG. 5 is a view showing a state wherein the position of the peripheral portion of a bonded substrate stack is measured by the measuring device.
Figure 6:
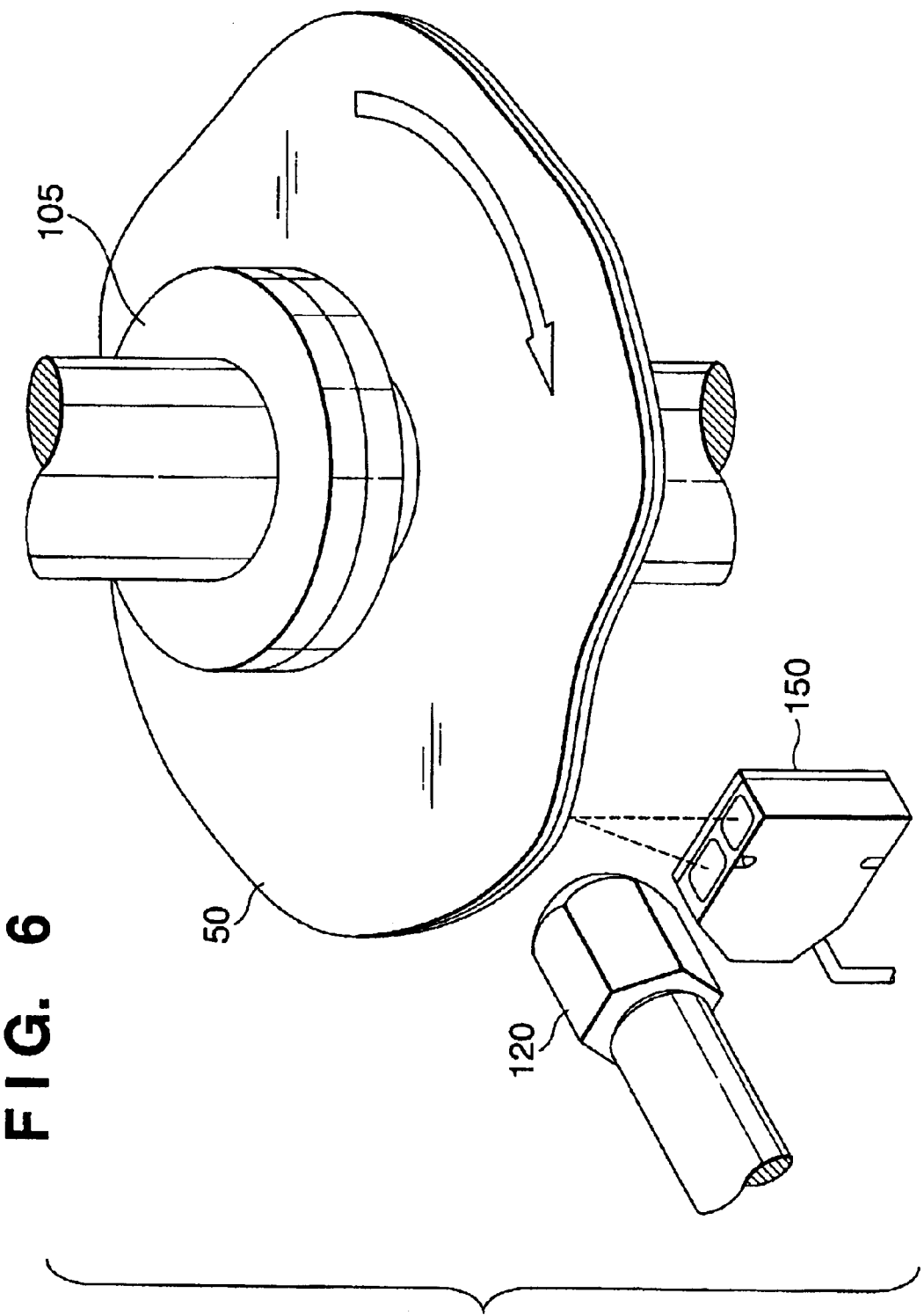
FIG. 6 is a view showing a state wherein the position of the peripheral portion of a bonded substrate stack is measured by the measuring device.

Then, the vertical position of the peripheral portion of the bonded substrate 50 (in this embodiment, the peripheral portion on the lower surface of the bonded substrate stack 50) is measured by the measuring device 150 while rotating the bonded substrate stack 50 by driving the motor 101 under control by the controller 160. The measurement result can be recorded by the controller 160 as the vertical position of the peripheral portion of the bonded substrate stack 50 obtained as a function of the rotational angle of the bonded substrate stack 50. FIGS. 5 and 6 show how the position of the peripheral portion of the bonded substrate stack 50 is measured by the measuring device 150.

Figure 7:
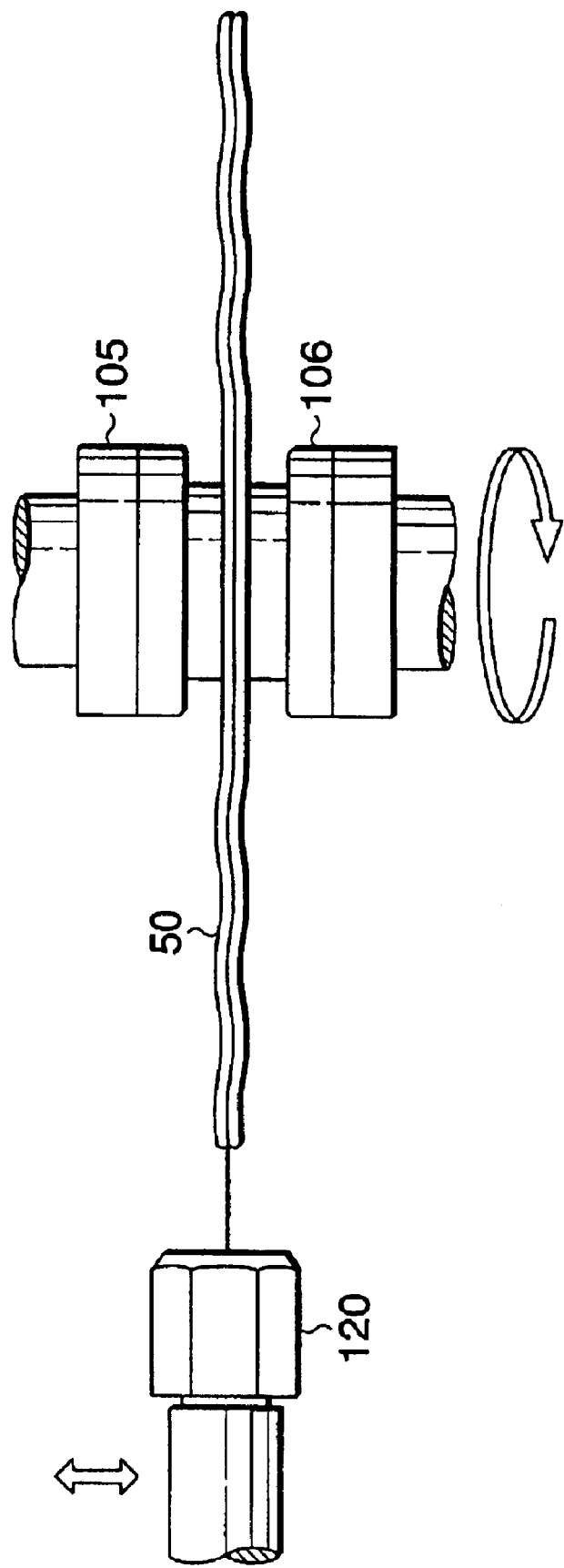
FIG. 7 is a view showing a state wherein the bonded substrate stack is separated.
Figure 8:
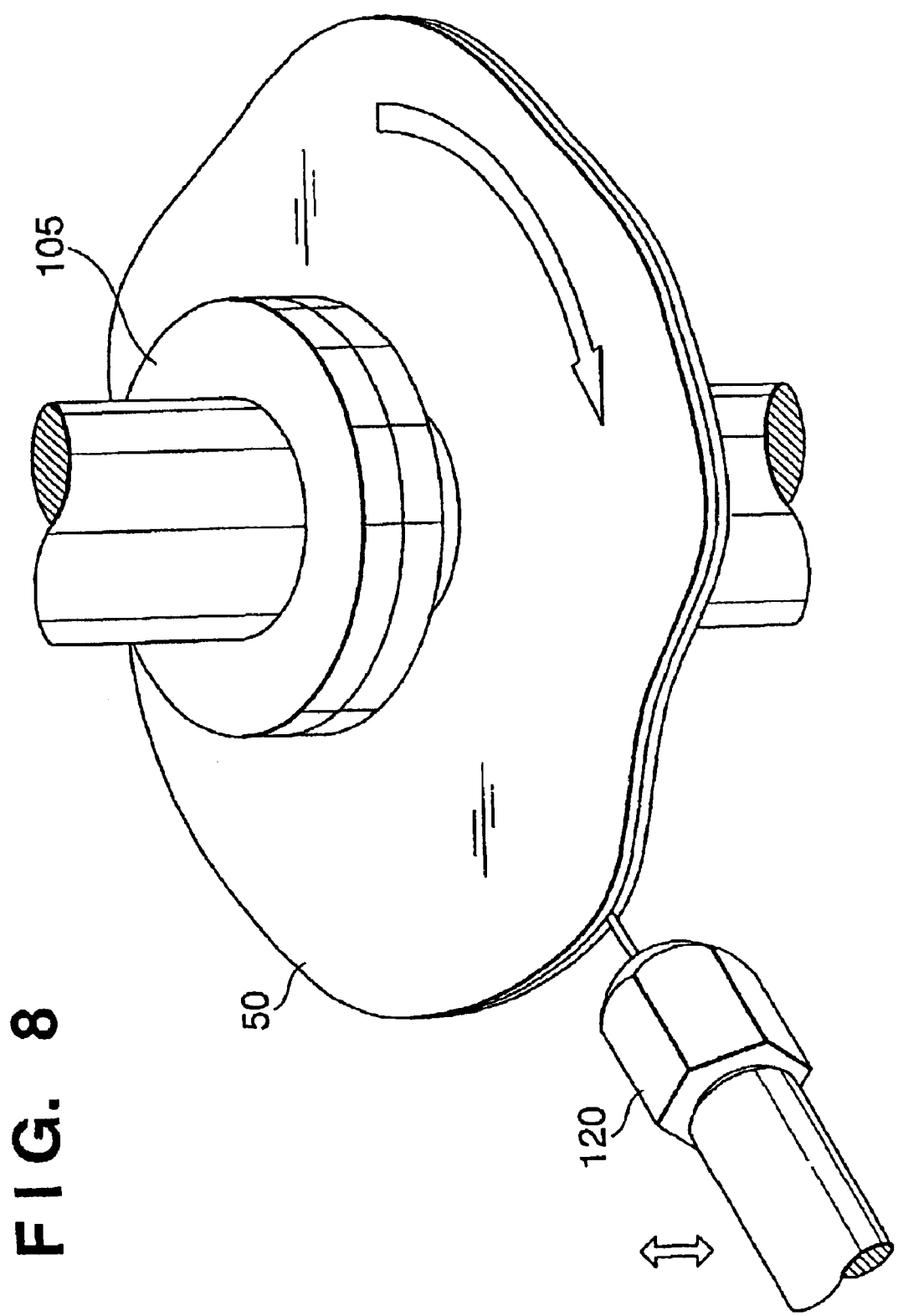
FIG. 8 is a view showing a state wherein the bonded substrate stack is separated.

The bonded substrate stack 50 is rotated by driving the motor 101 while ejecting a fluid from the nozzle 120 under control by the controller 160. At this time, the controller 160 drives the position adjusting mechanism 140 in synchronism with rotation of the bonded substrate stack 50 on the basis of the measurement result so that the fluid ejected from the nozzle 120 may always be injected into the concave portion of the bonded substrate stack 50. FIGS. 7 and 8 show a state wherein the bonded substrate stack 50 is separated.

The bonded substrate stack 50 is separated into two substrates completely to the center typically after several turns.

After the bonded substrate stack 50 is separated, the air cylinder 110 is actuated to move the lower substrate holding portion 106 downward. The two separated substrates are received from the substrate holding portions 105 and 106 by, e.g., a transfer robot.

Figure 9:
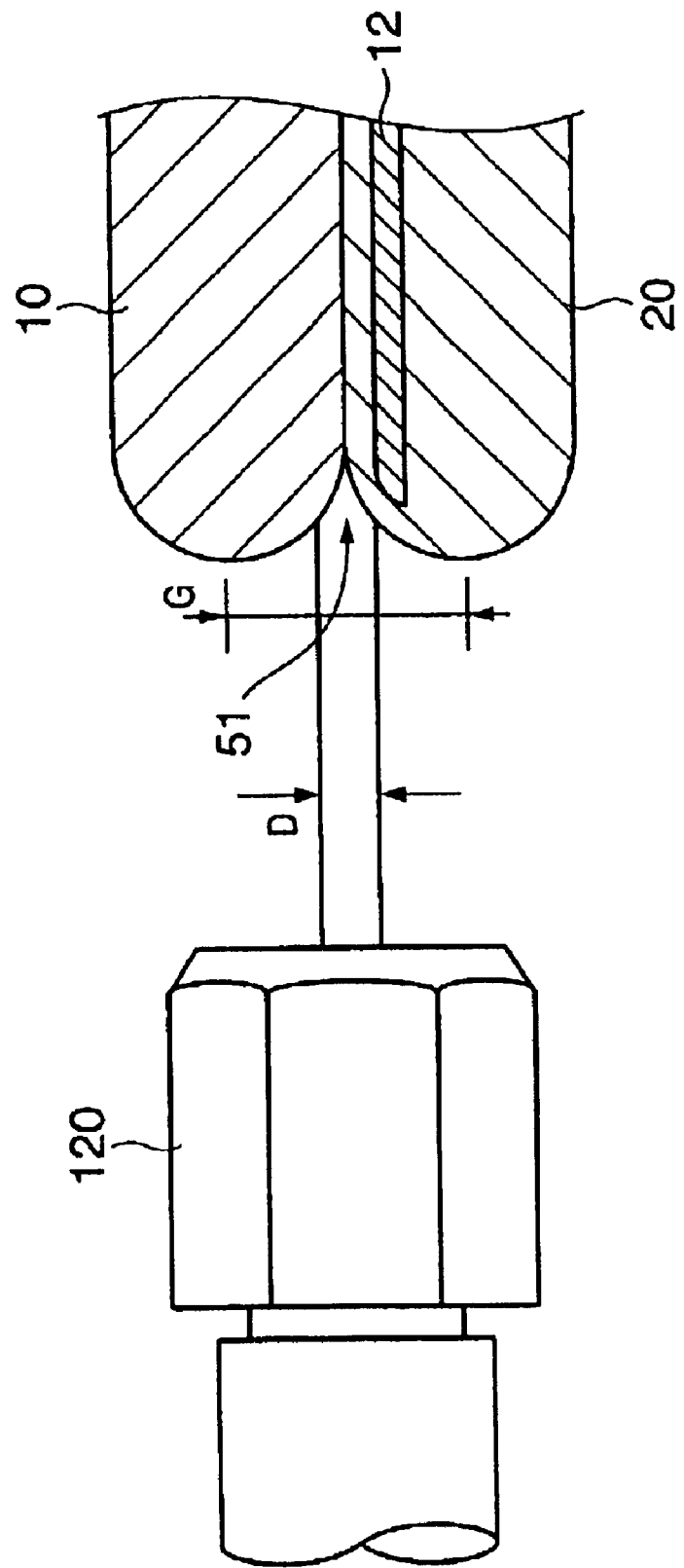
FIG. 9 is an enlarged view of the nozzle and bonded substrate stack (peripheral portion)

FIG. 9 is an enlarged view of the nozzle 120 and bonded substrate stack (peripheral portion) 50. As shown in FIG. 9, the bonded substrate stack 50 or a plate member to be separated preferably has a y-shaped concave portion 51 in its section. Forming the concave portion 51 in the bonded substrate stack 50 or plate member enables a fluid from the nozzle 120 to be efficiently injected to the porous layer 12, thus resulting in smooth separation at the porous layer 12. As described previously, this concave portion 51 always forms when a bonded substrate stack is formed using a first substrate (seed wafer) and second substrate (handle wafer), each of which is a general wafer that has a beveling portion with a round sectional shape.

Preferably, each of the first and second substrates 10 and 20 constituting the bonded substrate stack 50 has a thickness of 100 to 2,000 $\mu$m and, typically, about 700 $\mu$m. A width G of the concave portion 51, which is formed when each of the first and second substrates 10 and 20 has a thickness of 700 $\mu$m, is about 700 $\mu$m. Preferably, a diameter D of a fluid to be ejected from the nozzle 120 is about 50 to 1,000 $\mu$m and, typically, about 100 $\mu$m. At this time, the diameter (width) D of the fluid is preferably $\frac{1}{20}$ to $\frac{1}{2}$ the width G of the concave portion 51.

Note that in the present invention, a liquid such as water or an etchant, a gas such as air, nitrogen or argon, a fluid mixture of liquid and gas, or the like may be used as a fluid.

Movement control of at least one of a bonded member and a fluid ejecting potion in accordance with the distortion amount of the periphery of the member so as to make a fluid to be injected to the concave portion (particularly, the bonding interface) of the bonded member, need not be performed until the bonded member is completely separated. Instead, control may be performed only while the bonded member is rotated by 90°, preferably by 180°, and more preferably, once (by 360°), and then the bonded member may be separated while the bonded member and ejecting portion are fixed in position.

[Example of Semiconductor Device]

A semiconductor device using a semiconductor substrate that can be manufactured by the above substrate manufacturing method (FIGS. 1A to 1E) and a method of manufacturing the device will be described next with reference to FIGS. 12A to 12D.

FIGS. 12A to 12D are sectional views showing a method of manufacturing a semiconductor device using a semiconductor substrate that can be manufactured using the substrate manufacturing method according to the preferred embodiment of the present invention.

First, an SOI substrate having a semiconductor layer as a non-porous layer 13 and an insulating layer as a non-porous layer 14 is manufactured using the above substrate manufacturing method. An active region 13' where a transistor is to be formed and an element isolation region 54 are formed by a method of patterning the non-porous semiconductor layer (SOI layer) 13 on the buried insulating layer 14 into an island shape or an oxidation method called LOCOS (FIG. 12A).

Figure 12A:
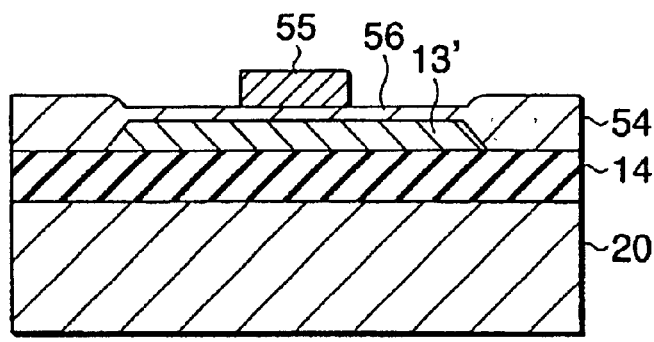
FIGS. 12A to 12D are sectional views showing a method of manufacturing a semiconductor device using a semiconductor substrate manufactured using the substrate manufacturing method according to the preferred embodiment of the present invention.

Next, a gate insulating film 56 is formed on the surface of the SOI layer (FIG. 12A). Examples of the material of the gate insulating film 56 are silicon oxide, silicon nitride, silicon oxynitride, aluminum oxide, tantalum oxide, hafnium oxide, titanium oxide, scandium oxide, yttrium oxide, gadolinium oxide, lanthanum oxide, zirconium oxide, and a glass mixture thereof. The gate oxide film 56 can be formed by, e.g., oxidizing the surface of the SOI layer or depositing an appropriate substance on the surface of the SOI layer by CVD or PVD.

A gate electrode 55 is formed on the gate insulating film 56 (FIG. 12A). The gate electrode 55 can be formed from, e.g., polysilicon doped with a p- or n-type impurity, a metal such as tungsten, molybdenum, titanium, tantalum, aluminum, or copper or an alloy containing at least one of them, a metal silicide such as molybdenum silicide, tungsten silicide, or cobalt silicide, or a metal nitride such as titanium nitride, tungsten nitride, or tantalum nitride. The gate insulating film 56 may be formed by stacking a plurality of layers formed from different materials, like a polycide gate. The gate electrode 55 can be formed either by, e.g., a method called Salicide (self-align silicide) or by a method called a damascene gate process, or by any other method. With the above process, a structure shown in FIG. 12A is obtained.

Figure 12B:
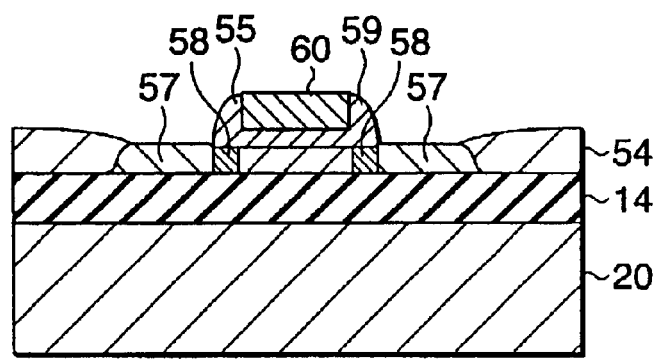

Next, an n-type impurity such as phosphor, arsenic, or antimony or a p-type impurity such as boron is doped into the active region 13', thereby forming relatively lightly-doped source and drain regions 58 (FIG. 12B). The impurity can be doped by, e.g., ion implantation and annealing.

An insulating film is formed to cover the gate electrode 55 and then etched back, thereby forming a side wall 59 on the side surface of the gate electrode 55.

An impurity having the same conductivity type as described above is doped into the active region 13' again, thereby forming relatively heavily-doped source and drain regions 57. With the above process, a structure shown in FIG. 12B is obtained.

Figure 12C:
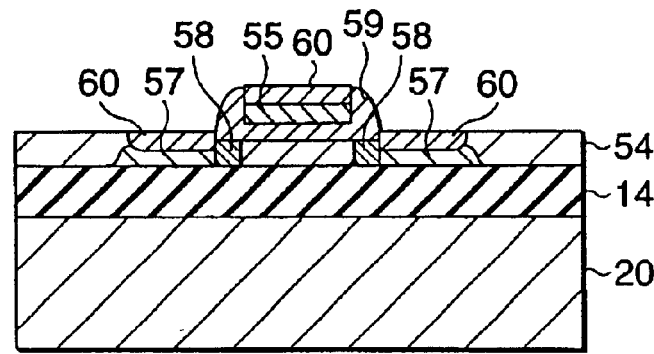

A metal silicide layer 60 is formed on the upper surface of the gate electrode 55 and on the upper surfaces of the source and drain regions 57. Examples of the material of the metal silicide layer 60 are nickel silicide, titanium silicide, cobalt silicide, molybdenum silicide, and tungsten silicide. Such a silicide can be formed by depositing a metal on the upper surface of the gate electrode 55 and on the upper surfaces of the source and drain regions 57, performing annealing to cause the metal to react with underlying silicon, and removing an unreacted portion of the metal using an etchant such as sulfuric acid. The surface of the silicide layer may be nitrided as needed. With the above process, a structure shown in FIG. 12C is obtained.

Figure 12D:
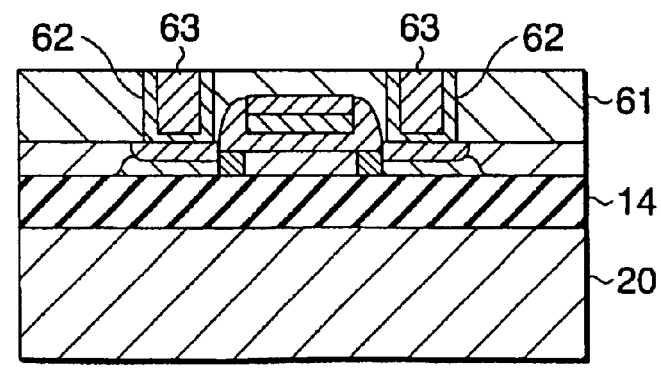
Figure 13:
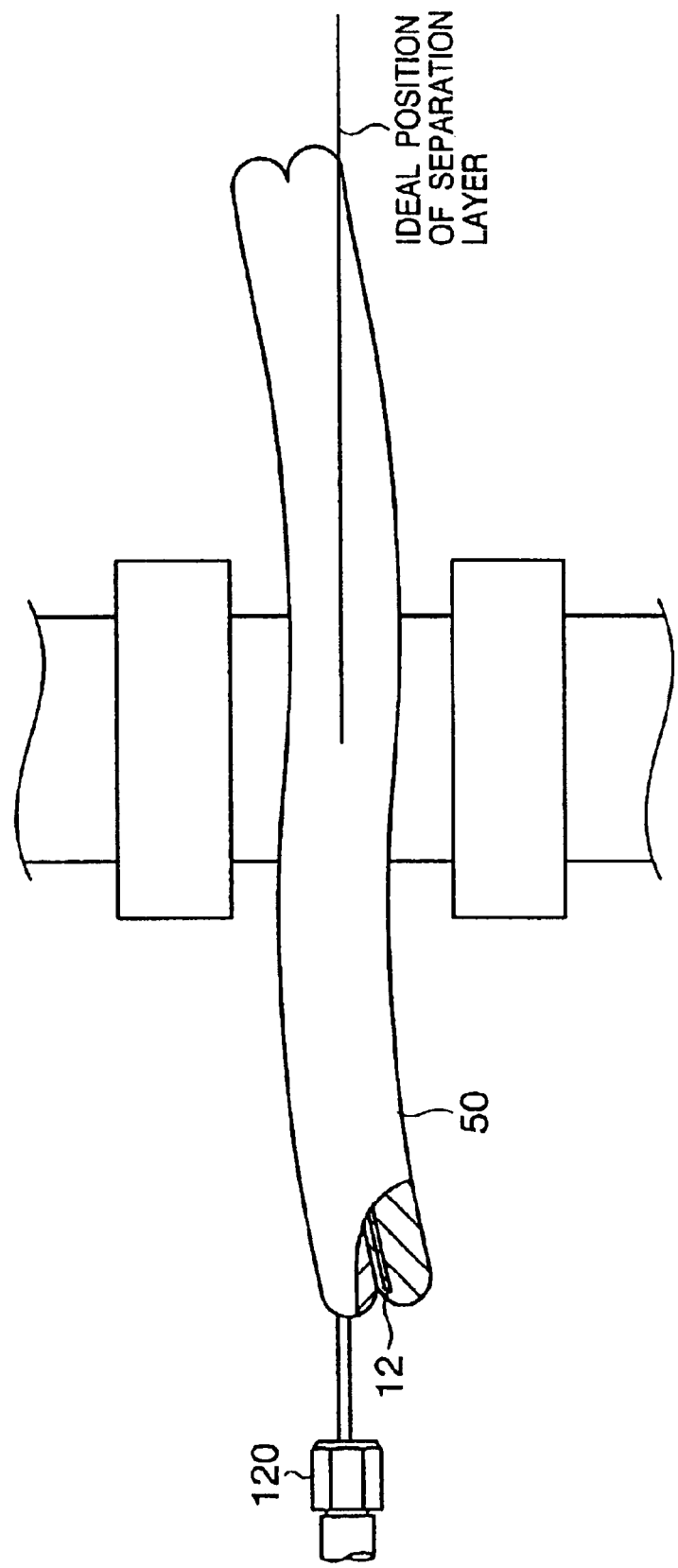
FIG. 13 is a view showing a state wherein a bonded substrate stack which is largely distorted is separated into two substrates at a porous layer.

An insulating film 61 is formed on the upper surface of the gate electrode and on the upper surfaces of the source and drain regions, which are converted into a silicide (FIG. 12D). As the material of the insulating film 61, silicon oxide containing phosphor and/or boron can be used.

Contact holes are formed in the insulating film 61 by CMP, as needed. When photolithography using a KrF excimer laser, ArF excimer laser, $F_2$ excimer laser, electron beam, or X-rays is used, a rectangular contact hole with a side smaller than 0.25 μm or a circular contact hole having a diameter smaller than 0.25 μm can be formed.

Next, the contact holes are filled with a conductor. To fill the contact holes with a conductor, a film of a refractory metal or a nitride thereof, which serves as a barrier metal 62, is formed on the inner surface of each contact hole, and after that, a conductor 63 such as a tungsten alloy, aluminum, aluminum alloy, copper, or copper alloy is deposited by CVD, PVD, or plating. A conductor may be deposited to a level higher than the upper surface of the insulating film 61 and removed by etch back or CMP. Alternatively, before the contact holes are filled with the conductor, the surface of the silicide layer in the source and drain regions, which is exposed to the bottom portion of each contact hole, may be nitrided. With the above process, a transistor such as an FET can be formed on the SOI layer, and a semiconductor device having a transistor with a structure shown in FIG. 12D can be obtained.

When the thickness and impurity concentration of the active layer (SOI layer) 13' are defined such that a depletion layer formed upon applying a voltage to the gate electrode reaches the upper surface of the buried insulating layer 14, the formed transistor operates as a fully depleted transistor. When the thickness and impurity concentration of the active layer (SOI layer) 13' are defined such that the depletion layer does not reach the upper surface of the buried insulating layer 14, the formed transistor operates as a partially depleted transistor.

According to the present invention, in separating a plate member such as a bonded substrate stack, a fluid can be always injected to an appropriate position of the plate member. This improves the reproducibility and yield in separating a plate member such as a bonded substrate stack.

As many apparently widely different embodiments of the present invention can be made without departing from the spirit and scope thereof, it is to be understood that the invention is not limited to the specific embodiments thereof except as defined in the claims.

What is claimed is:

1. A separating method of separating a member using a fluid, comprising the steps of: measuring a distortion amount of a peripheral portion of a member which has a concave portion on a peripheral side of the member and a separation layer inside; moving, at least one of the member, and an ejecting portion while separating the member by ejecting a fluid from the ejecting portion, in accordance with the measured distortion amount of the peripheral portion of the member so that the fluid ejected from the ejecting portion is injected into the concave portion.

2. The method according to claim 1, wherein
   the member is a bonded member formed by bonding first and second substrates, and
   in the moving step, at least one of the member and the ejecting portion is moved so that the fluid hits a bonding interface of the concave portion.

3. The method according to claim 1, wherein the member is a bonded member obtained by bonding, through an insulating layer, a first substrate having a non-porous single-crystal silicon layer on the separation layer, and a second substrate.

4. The method according to claim 1, wherein the measuring step is performed before the fluid is ejected or while the fluid is ejected.

5. A processing method of processing a plate member which has a separation layer, comprising: the holding step of holding a plate member by a holding portion;
   the measuring step of measuring a position of a peripheral portion of the plate member held by the holding portion; and
   the separation step of ejecting a fluid from an ejecting portion and separating the plate member held by the holding portion at the separation layer by using the fluid, wherein in the separation step, at least one of the holding portion and the ejecting portion is dynamically driven on the basis of a measurement result obtained in the measuring step so that the fluid ejected from the ejecting portion is injected into a concave portion on a peripheral side of the plate member held by the holding portion.

6. The method according to claim 5, wherein in the separation step, at least one of the holding portion and the ejecting portion is dynamically driven on the basis of the measurement result obtained by a measuring device so that the fluid ejected from the ejecting portion is injected into a bonding interface of the plate member, which is located at the concave portion on the peripheral side surface, or into the separation layer through the concave portion.

7. The method according to claim 5, wherein in the measuring step, a position, of the peripheral portion of the plate member held by the holding portion, in a direction perpendicular to the separation layer is measured.

8. The method according to claim 7, wherein in the separation step, at least one of the holding portion and ejecting portion is dynamically driven in the direction perpendicular to the separation layer on the basis of the measurement result obtained in the measuring step.

9. The method according to claim 5, wherein in the separation step, a direction of the ejecting portion is dynamically changed on the basis of the measurement result obtained in the measuring step.

10. The method according to claim 5, wherein in the separation step, the plate member held by the holding portion is separated while rotating the plate member about an axis perpendicular to the separation layer so that the fluid ejected from the ejecting portion is injected into the plate member throughout a perimeter of the plate member.

11. The method according to claim 10, wherein in the measuring step, the position of the peripheral portion of the plate member held by the holding portion is measured throughout a perimeter of the plate member while rotating the plate member about the axis perpendicular to the separation layer.

12. The method according to claim 5, wherein the separation step is performed after the measuring step.

13. The method according to claim 5, wherein the separation step is performed simultaneously with the measuring step.

14. The method according to claim 5, wherein the plate member has a disk shape.

15. The method according to claim 5, wherein the holding portion horizontally holds the plate member.

16. The method according to claim 5, wherein the separation layer is a layer formed by anodization or ion implantation.

17. A semiconductor substrate manufacturing method comprising the steps of:

forming a bonded substrate stack as a plate member by bonding a first substrate having a separation layer inside and a transfer layer on the separation layer to a second substrate; and separating the bonded substrate stack at the separation layer by using the processing method of claim 5.

18. A semiconductor device manufacturing method comprising the steps of:

preparing an SOI substrate using the manufacturing method of claim 17; and isolating an SOI layer of the SOI substrate and forming a transistor on the isolated SOI layer.

* * * * *